US009618595B2

United States Patent
Kim et al.

(10) Patent No.: US 9,618,595 B2
(45) Date of Patent: Apr. 11, 2017

(54) MAGNETIC RESONANCE IMAGING SYSTEM, DATA PROCESSING APPARATUS, AND METHOD FOR GENERATING MAGNETIC RESONANCE IMAGE

(71) Applicants: Samsung Electronics Co., Ltd., Suwon-si (KR); Korea University Research and Business Foundation, Seoul (KR)

(72) Inventors: Young Beom Kim, Yongin-si (KR); Yeunchul Ryu, Hwaseong-si (KR); Jaemock Yi, Hwaseong-si (KR); Chang-Hyun Oh, Seoul (KR)

(73) Assignees: Samsung Electronics Co., Ltd., Suwon-si (KR); Korea University Research and Business Foundation, Seoul (KR)

( * ) Notice: Subject to any disclaimer, the term of this patent is extended or adjusted under 35 U.S.C. 154(b) by 698 days.

(21) Appl. No.: 14/060,723

(22) Filed: Oct. 23, 2013

(65) Prior Publication Data
US 2014/0203805 A1    Jul. 24, 2014

(30) Foreign Application Priority Data

Jan. 21, 2013 (KR) .................. 10-2013-0006576

(51) Int. Cl.
*G01R 33/483* (2006.01)
(52) U.S. Cl.
CPC .............................. *G01R 33/4835* (2013.01)

(58) Field of Classification Search
CPC ................................................ G01R 33/4835
See application file for complete search history.

(56) References Cited

U.S. PATENT DOCUMENTS

| 4,665,367 | A | * | 5/1987 | Kramer | G01R 33/4835 |
| | | | | | 324/309 |
| 5,422,572 | A | * | 6/1995 | Yao | G01R 33/4835 |
| | | | | | 324/309 |
| 8,022,701 | B2 | | 9/2011 | Chen et al. | |
| 2014/0111201 | A1 | * | 4/2014 | Kim | G01R 33/543 |
| | | | | | 324/309 |
| 2014/0132261 | A1 | * | 5/2014 | Kim | G01R 33/4835 |
| | | | | | 324/309 |

(Continued)

FOREIGN PATENT DOCUMENTS

| JP | 2001-198100 A | 7/2001 |
| JP | 2004-000616 B2 | 1/2004 |

(Continued)

*Primary Examiner* — G. M. Hyder
(74) *Attorney, Agent, or Firm* — NSIP Law

(57) ABSTRACT

A method and apparatus for generating a magnetic resonance image including applying to a target first radio frequency (RF) pulses having phases and different frequencies to excite a plurality of sub-volumes constituting a volume of the target, and acquiring first magnetic resonance signals from the plurality of sub-volumes, and applying to the target second RF pulses having the same frequencies as the frequencies of the first RF pulses and phases at least one of which is different from the phases of the first RF pulses, and acquiring second magnetic resonance signals from the plurality of sub-volumes. Also, data may be generated based on the first and second magnetic resonance signals.

15 Claims, 5 Drawing Sheets

(56) References Cited

U.S. PATENT DOCUMENTS

| | | | |
|---|---|---|---|
| 2014/0132264 A1* | 5/2014 | Kim | G01R 33/4835 324/309 |
| 2014/0210465 A1* | 7/2014 | Kim | G01R 33/3635 324/309 |
| 2014/0218033 A1* | 8/2014 | Ryu | G01R 33/34046 324/319 |
| 2014/0232392 A1* | 8/2014 | Ryu | G01R 33/5659 324/308 |

FOREIGN PATENT DOCUMENTS

| | | |
|---|---|---|
| JP | 2006-175223 A | 7/2006 |
| KR | 10-2009-0014982 A | 2/2009 |

\* cited by examiner

MAGNETIC RESONANCE IMAGING SYSTEM, DATA PROCESSING APPARATUS, AND METHOD FOR GENERATING MAGNETIC RESONANCE IMAGE

CROSS-REFERENCE TO RELATED APPLICATIONS

This application claims the benefit under 35 U.S.C. §119 (a) of Korean Patent Application No. 10-2013-0006576, filed on Jan. 21, 2013, in the Korean Intellectual Property Office, the entire disclosure of which is incorporated herein by reference for all purposes.

BACKGROUND

1. Field

The present disclosure relates to a magnetic resonance imaging (MRI) system, and a method for generating a magnetic resonance image.

2. Description of the Related Art

A diagnostic image of a subject is typically obtained using a medical imaging device or technique such as magnetic resonance imaging (MRI), computer tomography (CT), or positron emission tomography (PET).

An MRI system typically obtains an image of biological tissue of a human body by using a magnetic field generated by a magnetic force. The MRI system applies a high frequency signal to the biological tissue to generate a resonance phenomenon by molecules within the biological tissue. Gradients are typically applied to the biological tissue to obtain space information about the biological tissue based on the tissues response to the applied gradients.

SUMMARY

In a general aspect, there is provided a method for generating a magnetic resonance image, the method including applying to a target first radio frequency (RF) pulses having phases and different frequencies to simultaneously excite a plurality of sub-volumes constituting a volume of the target, and acquiring first magnetic resonance signals from the plurality of sub-volumes; applying to the target second RF pulses having the same frequencies as the frequencies of the first RF pulses and phases at least one of which is different from the phases of the first RF pulses, and acquiring second magnetic resonance signals from the plurality of sub-volumes; and generating image data of the plurality of sub-volumes based on the first and second magnetic resonance signals.

One pulse of the first RF pulses and another pulse of the second RF pulses may have a same frequency, and the one pulse and the another pulse may have different phases.

The first RF pulses may have a same phase and the second RF pulses may have different phases.

The generating of the image comprises generating the data using a first sensitivity of a multi-channel coil with respect to the first RF pulses and a second sensitivity of the multi-channel coil with respect to the second RF pulses.

The method may further include generating a total matrix including a first sensitivity of a multi-channel coil with respect to the first RF pulses and a second sensitivity of the multi-channel coil with respect to the second RF pulses, wherein the generating of the image data comprises generating the data based on an inverse matrix of the total matrix and the first and second magnetic resonance signals.

A total volume of the target is grouped such that neighboring sub-volumes belong to at least two groups, and each of the first and second RF pulses simultaneously excite sub-volumes included in a selected one of the at least two groups.

The acquiring of the first and second magnetic resonance signals comprises:

encoding each of the plurality of excited sub-volumes; and acquiring the first and second magnetic resonance signals from the plurality of sub-volumes by using multi-channel coils.

In another general aspect, there is provided a magnetic resonance imaging (MRI) system, the MRI system include radio frequency (RF) coils configured to apply to a target first RF pulses having phases and different frequencies to simultaneously excite a plurality of sub-volumes constituting a volume of the target, and acquire first magnetic resonance signals from the plurality of sub-volumes, and apply to the target second RF pulses having the same frequencies as the frequencies of the first RF pulses and phases at least one of which is different from the phases of the first RF pulses, and acquire second magnetic resonance signals from the plurality of sub-volumes; and a data processing apparatus that generates image data of the plurality of sub-volumes based on the first and second magnetic resonance signals.

One pulse of the first RF pulses and another pulse of the second RF pulses have a same frequency, and the one pulse and the another pulse have different phases.

The first RF pulses have a same phase and the second RF pulses have different phases.

The data processing apparatus is configured to generate the image data by using a first sensitivity of a multi-channel coil with respect to the first RF pulses and a second sensitivity of the multi-channel coil with respect to the second RF pulses.

The data processing apparatus is configured to generate a total matrix including a first sensitivity of a multi-channel coil with respect to the first RF pulses and a second sensitivity of the multi-channel coil with respect to the second RF pulses, and generate the data based on an inverse matrix of the total matrix and the first and second magnetic resonance signals.

A total volume of the target is grouped such that neighboring sub-volumes belong to at least two groups, and each of the first and second RF pulses simultaneously excite sub-volumes included in a selected one of the at least two groups.

The RF coils are configured to apply RF pulses to encode each of the plurality of excited sub-volumes, and the RF coils are multi-channel coils that are configured to acquire the first and second magnetic resonance signals from the plurality of sub-volumes.

In another general aspect, there is provided a data generating apparatus which receives first magnetic resonance signals acquired from a plurality of sub-volumes constituting a volume of a target excited by first radio frequency (RF) pulses having different phases and different frequencies to simultaneously excite the plurality of sub-volumes, receives second magnetic resonance signals acquired from the plurality of sub-volumes excited by second RF pulses having the same frequencies as the frequencies of the first RF pulses and phases at least one of which is different from the phases of the first RF pulses, and generates image data of the plurality of sub-volumes based on the first and second magnetic resonance signals.

DETAILED DESCRIPTION

Figure 1:
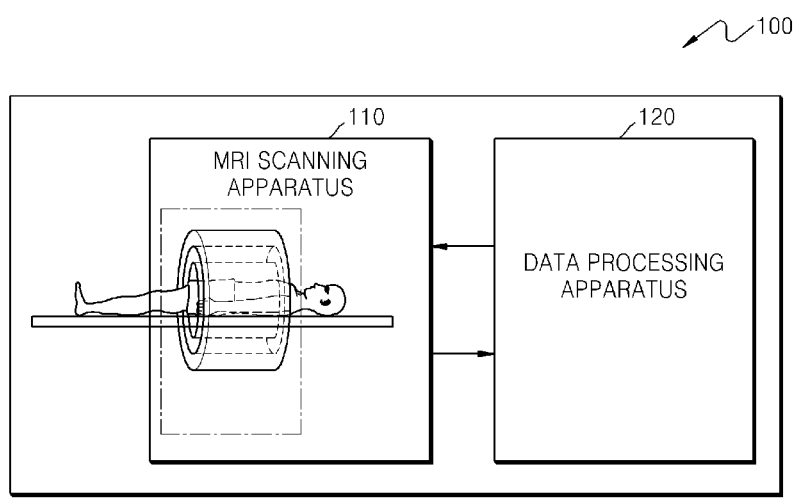
FIG. 1 is a diagram illustrating an example of a magnetic resonance imaging (MRI) system.

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of a magnetic resonance imaging (MRI) system 100. Referring to FIG. 1, the MRI system 100 includes an MRI scanning apparatus 110 and a data processing apparatus 120.

The MRI system 100 of FIG. 1 illustrates only an example of elements that are included in an MRI system 100. Thus, it may be understood by those of ordinary skill in the art to which the present inventive concept pertains that elements other than those shown in FIG. 1 may be included.

In this example, the MRI system 100 obtains an image including information about biological tissue within a target or target region using a non-invasive method. In an example, the obtained image may be a 3D image, but images having other dimensions may also be obtained.

In this example, the MRI system 100 obtains a diagnostics image of a target or target region using a magnetic field generated by a magnetic force. The target region may include the entire human body, a brain, a spine, a heart, a liver, an embryo, or the like. The MRI system 100 may include a hybrid MRI system combining another type of medical imaging system such as positron emission tomography (PET).

The MRI scanning apparatus 110 applies radio frequency (RF) pulses having a plurality of frequencies to the target or target region. The RF pulses simultaneously excite one or more sub-volumes of a plurality of sub-volumes within the target or target region. The MRI scanning apparatus 110 3D encodes each of the excited sub-volumes and acquires magnetic resonance signals from the sub-volumes by using multi-channel receiving coils.

In this example, to simultaneously excite the sub-volumes, the MRI scanning apparatus 110 applies RF pulses having frequencies corresponding to a Larmor frequency of each of the sub-volumes. The RF pulses are applied to a target region located in a static magnetic field.

The Larmor frequency is a precession frequency of an atomic nucleus magnetic moment. An atomic nucleus has a magnetic moment or a magnetic dipole moment due to its spinning motion. When there is no external magnetic field surrounding an atom, the magnetic moment of a nucleus is random, that is, there is no constant direction. When an atom is located in a static magnetic field, atomic nuclei are aligned in the direction of the static magnetic field in order to shift to a lower energy state. While each atomic nucleus is aligned and spinning, the magnetic moment of the nucleus performs a precessional motion. The precession frequency of the magnetic moment is referred to as the Larmor frequency. For example, the Larmor frequency may be determined by multiplying a gyromagnetic ratio with the intensity of the externally applied magnetic field.

In an example of simultaneously exciting M-number of sub-volumes, the RF pulses applied to the target are multi-band RF pulses. The multi-band RF pulses are obtained by modulating a single volume selective RF pulse according to a number M of designated sub-volumes. Also, since each of the RF pulses has a different phase, RF phase encoding may be performed.

In this example, the MRI scanning apparatus 110 applies the RF pulses and a sub-volume selective gradient to the target or target region in order to perform 3D encoding on each of the sub-volumes that are excited. For example, the MRI scanning apparatus 110 performs 3D encoding by applying a first encoding gradient in a first direction and a second encoding gradient in a second direction. Either of the first or second directions in which the first and second encoding gradients are applied may be the same as the direction in which the sub-volume selective gradient is applied.

In this example, the MRI scanning apparatus 110 additionally applies a frequency encoding gradient to the target or target region. For example, a first phase encoding gradient, a second phase encoding gradient, and a frequency encoding gradient may be applied to the target or target region to provide information about a position in a y-axis, z-axis, and x-axis directions, respectively. Accordingly, the first phase encoding gradient may perform y-axis phase encoding and the second phase encoding gradient may perform z-axis phase encoding.

In this example, the MRI system 100 of FIG. 1 also includes a data processing apparatus 120. The data processing apparatus 120 generates image data by using received magnetic resonance signals from the MRI scanning apparatus 110.

Figure 2:
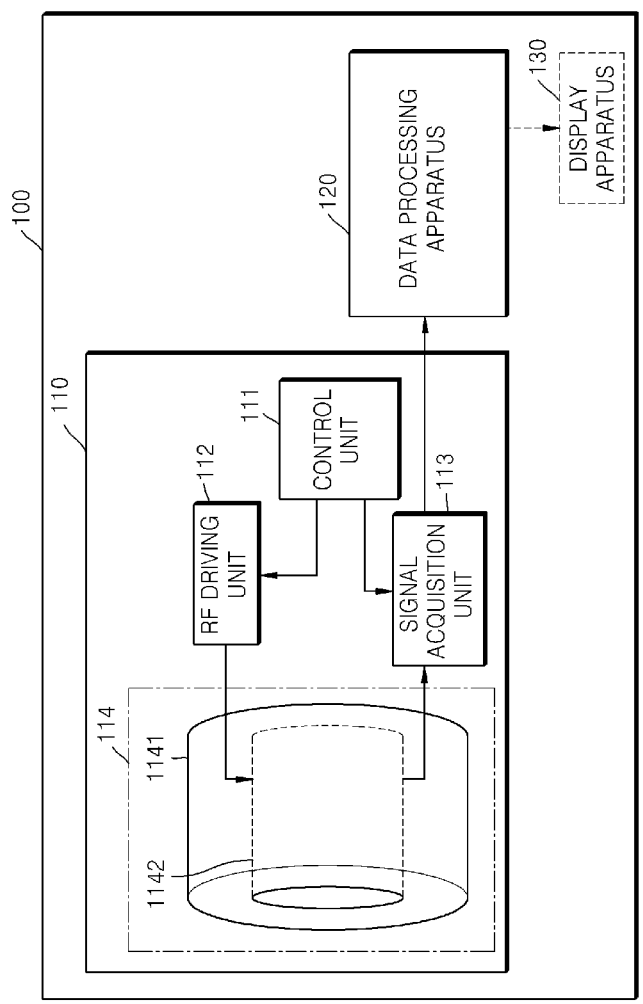
FIG. 2 is a diagram illustrating an example of the MRI system and MRI scanning apparatus.

FIG. 2 is a diagram illustrating an example of the MRI system 100 and the MRI scanning apparatus 110. Referring to FIG. 2, the MRI system 100 includes the MRI scanning apparatus 110 and the data processing apparatus 120. The MRI scanning apparatus 110 includes a control unit 111, an RF driving unit 112, a magnet apparatus 114, and a signal acquisition unit 113. The magnet apparatus 114 includes a magnetic force generation unit 1141 and RF coils 1142.

The MRI system 100 of FIG. 2 corresponds to the MRI system 100 of FIG. 1. Thus, the descriptions presented in relation to the MRI system 100 of FIG. 1 may be applied to the description of the MRI system 100 of FIG. 2 and thus any redundant descriptions will be omitted herein.

In this example, the MRI system 110 applies a predetermined pulse sequence to a target region to acquire magnetic resonance signals from the target region.

For example, the RF coils 1142 apply RF pulses having phases and different frequencies to the target region and acquire magnetic resonance signals from the target region. The RF coils 1142 apply to the target region RF pulses having different frequencies. The applied RF pulses simultaneously excite a plurality of sub-volumes within the volume of the target region. In an example, the RF pulses may have the same phase.

In this example, when applying RF pulses having different frequencies, the RF coils 1142 apply RF pulses having different phase sets. The phase set indicates a combination of phases of RF pulses. That is, the RF coils 1142 apply first RF pulses having phases and different frequencies to the target region and acquire magnetic resonance signals with respect to the first RF pulses. Then, the RF coils 1142 apply to the target regions second RF pulses having the same frequencies as the first RF pulses, and having phases at least one of which is different from the phases of the first RF pulses. In other words, the first RF pulses and the second RF pulses include RF pulses having the same frequencies but different phases. Thus, of the first RF pulses and the second RF pulses, at least one pair of RF pulses having the same frequency have different phases. The application of RF pulses having different phase sets by the RF coils 1142 will be described further with reference to FIG. 4.

In this example, the RF coils 1142 apply the first RF pulses, acquire magnetic resonance signals generated by the first RF pulses, then apply the second RF pulses, and acquire magnetic resonance signals generated by the second RF pulses. In other words, the RF coils 1142 acquire a first magnetic resonance signal by the first RF pulses and a second magnetic resonance signal by the second RF pulses.

Even though first and second RF pulses are described, the number of pulses applied by the RF coils 1142 is not limited thereto. Thus, the RF coils 1142 may apply RF pulses having different phase sets for an N number of times and acquire an N number of magnetic resonance signals. Also, while the RF coils 1142 are described as including both transmitting RF coils and receiving RF coils, the RF coils may include transceiving RF coils.

In an example, RF pulses applied by the RF transmitting coil of the RF coils 1142 to the target region include multi-band RF pulses. In an example, the RF coils 1142 include spatial encoding RF coils.

The RF receiving coil of the RF coils 1142 acquires signals from the target region and outputs the acquired signals to the data processing apparatus 120. In this example, The RF receiving coil is a multi-channel receiving coil. For example, the RF receiving coil may be a multi-channel receiving coil including 32 channels, but any other number of channels may be used.

In this example, the MRI scanning apparatus includes a signal acquisition unit 113. The signal acquisition unit 113 acquires the magnetic resonance signals output from the RF coils 1142 and performs predetermined processes. For example, the signal acquisition unit 113 may include an amplifier for amplifying the acquired magnetic resonance signals, a demodulator for demodulating the amplified magnetic resonance signals, an analog-to-digital converter (ADC) for converting the demodulated magnetic resonance signals to digital signals, and the like. The signal acquisition unit 113 may further include a storage medium (not shown) for storing the digitally converted magnetic resonance signals.

In this example, the MRI scanning apparatus includes a control unit 111. The control unit 111 controls an overall operation of the MRI scanning apparatus 110. For example, the control unit 111 controls the RF driving unit 112, the signal acquisition unit 113, and the magnet apparatus 114 of the MRI scanning apparatus.

In this example, the RF driving unit 112 controls the RF coils 1142 to generate RF pulses having a desired form. Also, in this example, the magnet apparatus 114 applies a magnetic field and RF pulses to the target region and reads out the magnetic resonance signals from the target region. To measure a magnetic feature of the target region, the magnet apparatus 114 may exist in a space shielded from an external space. Alternatively, the magnet apparatus 114 may be implemented as an open type magnet apparatus. The magnet apparatus includes a magnetic force generation unit 1141 that generates a magnetic force to have the target region located in a static magnetic field.

In this example, the MRI system 100 includes a data processing apparatus 120. The data processing apparatus 120 reconstructs magnetic resonance signals into image data corresponding to each of the sub-volumes. The data processing apparatus 120 uses the sensitivity of the multi-channel receiving coils as channel information.

For example, the data processing apparatus 120 stores sensitivities of coils that are previously measured. The sensitivities of coils are separately measured according to a phase set of RF pulses. For example, the sensitivity of coils when the first RF pulses are applied and when the second RF pulses are applied are different from each other. The data processing apparatus 120 stores the sensitivity of coils when the first RF pulses are applied as a first sensitivity and the sensitivity of coils when the second RF pulses are applied as a second sensitivity. In this example, the first RF pulses and the second RF pulses have different phase sets.

The sensitivity of coils when the first RF pulses are applied, as a first sensitivity, generate image data corresponding to each of the sub-volumes based on the magnetic resonance signals by using the first and second sensitivities. The sensitivity of coils when the first RF pulses are applied, as a first sensitivity, generates image data by an operation of the first and second sensitivities and the first and second magnetic resonance signals received from the signal acquisition unit 113. For example, the first and second sensitivities are presented by a matrix. The data processing apparatus 120 generates a total matrix by summing the first and second sensitivities. In this example, the data processing apparatus 120 generates image data by an operation of an inverse matrix of the total matrix and the first and second magnetic resonance signals. The sub-volumes indicate sub-volumes excited by the first or second RF pulse. The reconstructed image data indicates image data with respect to the excited sub-volumes.

In this example, the MRI system 100 includes a display apparatus 130. The display apparatus 130 displays a generated total volume image of the target region or an image of an area of interest within the total volume image of the target region. Although the MRI system 100 of FIG. 2 is illustrated to include the display apparatus 130, the display apparatus 130 may be provided outside the MRI system 100.

Figure 3:
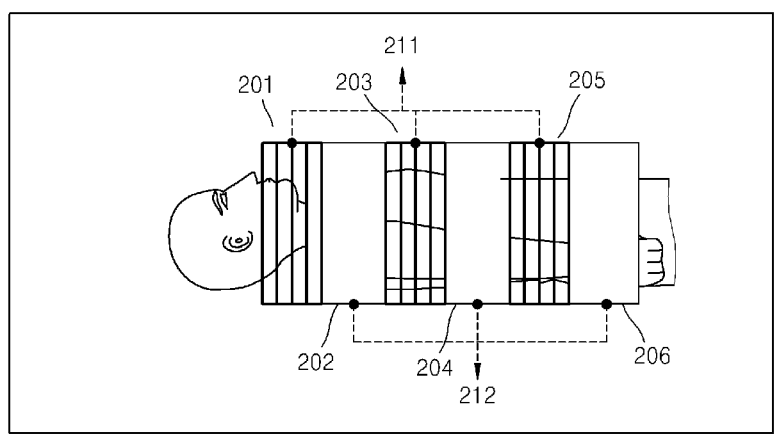
FIG. 3 is a diagram illustrating an example of a method of grouping a plurality of sub-volumes.

FIG. 3 illustrates an example of a method of grouping a plurality of sub-volumes. In FIG. 3, for convenience of explanation, two groups of sub-volumes are illustrated. The two groups are grouped such that any neighboring sub-volume of the target region belongs to a different group. In other examples, three or more groups may be included.

Referring to FIG. 3, a first group 211 and a second group 212 are illustrated and each of the first and second groups 211 and 212 includes three sub-volumes. Each of the sub-volumes included in each of the first and second groups 211 and 212 is illustrated to include four slices that are stacked. However, the sub-volumes may include a different number of stacked slices. For example, at least two slices may be stacked. In this example, the method of exciting the sub-volumes in the form of the stacked slices may prevent omission of image information resulting from inter-slice gaps between neighboring images. This prevents omission of information as opposed to a 2D MRI technique that excites the volume of a target region in units of slices.

Also, referring to FIG. 3, in an axial planar direction, a first sub-volume 201, a third sub-volume 203, and a fifth sub-volume 205 are included in the first group 211. A second sub-volume 202, a fourth sub-volume 204, and a sixth sub-volume 206 are included in the second group 212. In this example, the first sub-volume 201 is the first sub-volume in the axial planar direction.

Accordingly, the MRI scanning apparatus 110 applies the RF pulses to the target region to have the sub-volumes 201, 203, and 205, included in the first group 211, simultaneously excited. In an example, the MRI scanning apparatus 110 applies the RF pulses more than two that simultaneously excite the sub-volumes 201, 203, and 205 included in the first group 211. The RF pulses applied each time have the same frequency but different phase combinations.

In this example, after image data reconstruction for the first group 211 is completed, the MRI apparatus 110 applies the RF pulses to the target region to have the sub-volumes 202, 204, and 206, included in the second group 212, simultaneously excited. The RF pulses applied to the second group 212 are applied more than two times as is the case with the first group 211, and the phase combination is different at each time.

In this example, the MRI apparatus 110 applies first RF pulses to the target to have the sub-volumes 201, 203, and 205 of the first group 211 simultaneously excited. For example, the first RF pulses have different frequencies. The first RF pluses are pulses having a first frequency component to excite the first sub-volume 201, a third frequency component to excite the third sub-volume 203, and a fifth frequency component to excite the fifth sub-volume 205. Also, the MRI scanning apparatus 110 may apply the first RF pulses with respect to the second group 212 to simultaneously excite the sub-volumes 202, 204, and 206. The first RF pluses with respect to the second group 212 are pulses having a second frequency component to excite the second sub-volume 202, a fourth frequency component to excite the fourth sub-volume 204, and a sixth frequency component to excite the sixth sub-volume 206. For example, the frequencies of the RF pulses applied to the first group 211 and the frequencies of the RF pulses applied to the second group 212 are different from each other. The first and second RF pulses respectively applied to the first and second groups 211 and 212 may have the same phase.

Since the sub-volumes are grouped such that any neighboring sub-volume belongs to a different group, the MRI system 100 may increase a magnetic resonance image scanning speed. Also, since the RF pulses are applied to each group at least two times, the number of acquired magnetic resonance signals is increased. Accordingly, the MRI system 100 may generate a high resolution 3D volume image having a high signal to noise ratio (SNR).

Figure 4:
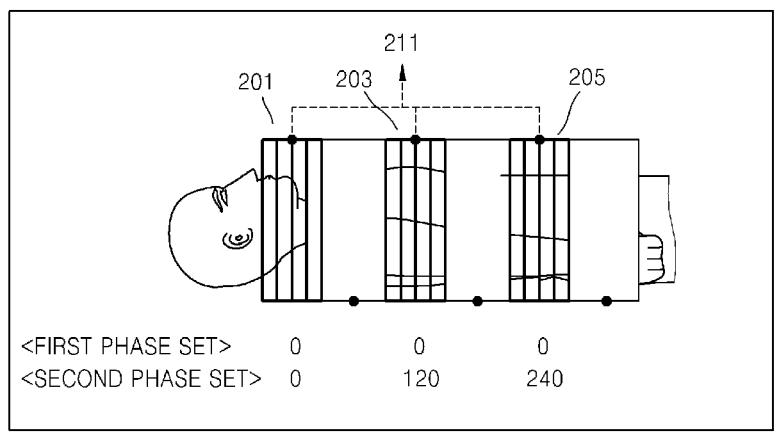
FIG. 4 is a diagram illustrating an example of phases applied to the sub-volumes.

FIG. 4 illustrates an example of phases applied to the sub-volumes. Referring to FIG. 4, the RF pulses applied to the first group 211 of sub-volumes 201, 203, and 205 have a first or second phase set. The first and second phase sets include combinations of different phases. For example, the first phase set has the same phase of 0° with respect to all of the first sub-volume 201, the third sub-volume 203, and the fifth sub-volume 205. The second phase set has phases of 0° for the first sub-volume 201, 120° for the third sub-volume 203, and 240° for the fifth sub-volume 205. The first phase set may be indicated by (0, 0, 0) and the second phase set may be indicated by (0, 120, 240).

Although FIG. 4 illustrates that the first group 211 includes three sub-volumes, the number of sub-volumes may be different. Accordingly, when the number of sub-volumes is changed, the combinations of phases of the first and second phase sets may vary accordingly. For example, when the first group 211 includes four sub-volumes, the first phase set may be (0, 0, 0, 0) and the second phase set may be (0, 90, 180, 270). In another example, when the first group 211 includes two sub-volumes, the first phase set may be (0, 0) and the second phase set may be (0, 180).

Also, the first and second phase sets of FIG. 4 are mere examples. Accordingly, there may be first and second phase sets in which RF pulses having the same frequency unlike the phase sets of FIG. 4.

Figure 5:
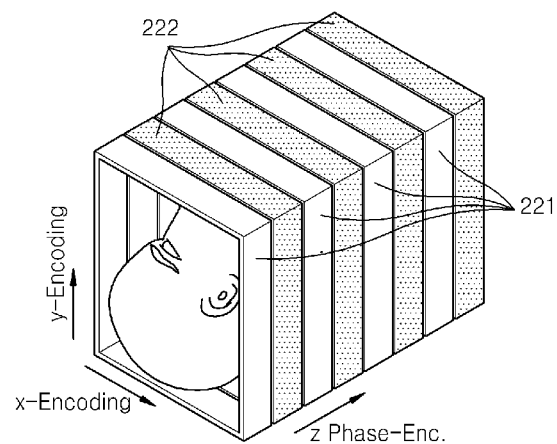
FIG. 5 is a diagram illustrating an example of a method of grouping a plurality of sub-volumes.

FIG. 5 illustrates an example of a method of grouping a plurality of sub-volumes. FIG. 5 illustrates a first group 221 and a second group 222. Referring to FIG. 5, the first sub-volume, the third sub-volume, the fifth sub-volume, and the seventh sub-volume, with respect to a z-axis direction indicating the axial planar direction, are included in the first group 221. The second sub-volume, the fourth sub-volume, the sixth sub-volume, and the eighth sub-volume, with respect to the z-axis direction, are included in the second group 222.

In this example, when a first phase encoding gradient with respect to a first direction and a second phase encoding gradient with respect to a second direction are applied to the target so that the MRI scanning apparatus 110 may perform 3D encoding, the first direction and the second direction may be a y-axis direction and the z-axis direction, respectively.

Since the MRI system 100 simultaneously excites the sub-volumes included in each of at least two groups that are grouped such that any neighboring sub-volumes can belong to different groups, the time for performing phase encoding with respect to the second direction may be reduced. In other words, the number of times phase encoding is performed with respect to the second direction may be reduced proportional to a value obtained by dividing the number of phase sets by the number of sub-volumes that are simultaneously excited.

For example, referring to FIG. 5, when four sub-volumes are included in each of the first and second groups 221 and 222 and the number of phase sets is two, the number of times phase encoding is performed with respect to the z-axis direction may be reduced by one-half compared to an example where grouping is not performed. Further, as a scan time is reduced, the MRI system 100 may quickly generate a high resolution 3D full volume image.

Figure 6:
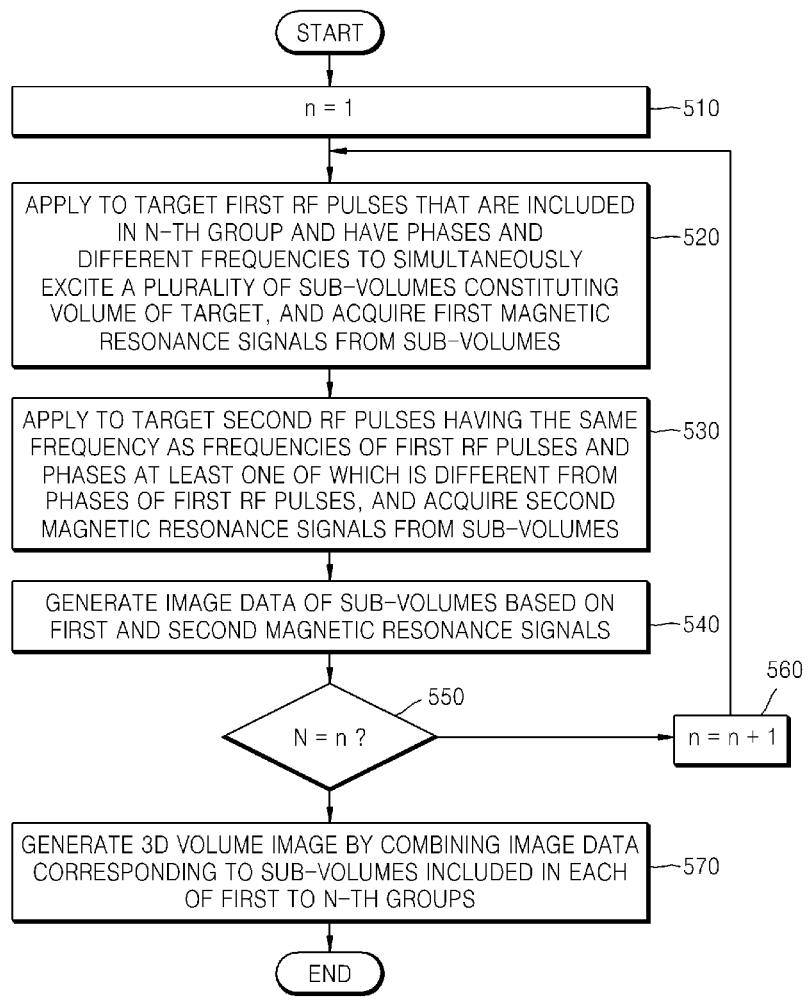
FIG. 6 is a flowchart illustrating an example of a method of generating a magnetic resonance image.

FIG. 6 is a flowchart illustrating an example of a method of generating a magnetic resonance image. Referring to FIG. 6, the MRI generation method may include operations that are processed in the MRI system 100 of FIGS. 1 and 2. Accordingly, the contents described above in relation to the MRI system 100 of FIGS. 1 and 2 may be applicable to the MRI method of FIG. 6.

In operation 510, the control unit 111 of the MRI scanning apparatus 110 initially sets n to 1.

In operation 520, the MRI scanning apparatus 110 applies to the target region first RF pulses that are included in an N-th group and have phases and different frequencies to simultaneously excite a plurality of sub-volumes within the volume of a target region. First magnetic resonance signals are acquired from the sub-volumes.

In operation 530, the MRI scanning apparatus 110 applies to the target second RF pulses having the same frequencies as the frequencies of the first RF pulses and at least one phase which is different from the phases of the first RF pulses. Second magnetic resonance signals are acquired from the sub-volumes.

In a case in which the first RF pulses have a first phase set and the second RF pulses have a second phase set, the MRI scanning apparatus 110 applies the first RF pulses having the first phase set and a plurality of frequencies to the target region to have the sub-volumes simultaneously excited. The MRI scanning apparatus 110 performs 3D encoding on each of the excited sub-volumes and acquires the first magnetic resonance signals from the sub-volumes. The MRI scanning apparatus 110 acquires the second magnetic resonance signals based on the second RF pulses having the second phase set through the same process as is the case with the first RF pulses.

In operation 540, the data processing apparatus 120 generates image data of the sub-volumes based on the first and second magnetic resonance signals.

In operation 550, the MRI scanning apparatus 110 determines whether the operations 520 to 540 are performed with respect to all groups (first to N-th groups) constituting the target region. According to a result of the determination, if the operations 520 to 540 are not performed with respect to all groups constituting the target region, the operation 560 is performed. Otherwise, operation 570 is performed.

In operation 560, the control unit 111 of the MRI scanning apparatus 110 sets n to a value increased by 1 and then performs the operation 520. Accordingly, operation 560 initiates the repeating of operations 520 to 540 until image data of the all sub-volumes of the target region is generated.

For example, when the sub-volumes of the target region are divided into first and second groups, the data processing apparatus 120 acquires magnetic resonance signals from the sub-volumes included in the first group and generates image data corresponding to each of the sub-volumes included in the first group. The operations performed with respect to the first group are then repeated for the second group. This may be performed sequentially or in parallel. Accordingly, the data processing apparatus 120 generates image data corresponding to each of the sub-volumes included in the second group through the same process as the process performed for the first group.

In operation 570, the data processing apparatus 120 generates a 3D volume image by combining the image data corresponding to the sub-volumes included in each of the first to N-th groups. In this example, all groups within the target region are the first to N-th groups.

The MRI apparatus 100, MRI scanning apparatus 110, data processing apparatus 120, the display apparatus 130, and all units described above may be implemented using one or more hardware components, or a combination of one or more hardware components and one or more software components. A hardware component may be, for example, a physical device that physically performs one or more operations, but is not limited thereto. Examples of hardware components include controllers, microphones, amplifiers, low-pass filters, high-pass filters, band-pass filters, analog-to-digital converters, digital-to-analog converters, and processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

Software or instructions for controlling a processing device, such as those described in FIG. 6, to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMS, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for generating a magnetic resonance image, the method comprising:
    applying, to a target, a first radio frequency (RF) pulse comprising different frequency components to simultaneously excite a plurality of non-contiguous sub-volumes constituting a volume of the target, and acquiring first magnetic resonance signals from the plurality of sub-volumes;
    applying, to the target, a second RF pulse comprising substantially the same frequency components as the first RF pulse and at least one phase different from phases of the first RF pulse, and acquiring second magnetic resonance signals from the plurality of sub-volumes; and
    generating image data of the plurality of sub-volumes based on the first and second magnetic resonance signals.

2. The method of claim 1, wherein the first RF pulse and the second RF pulse have the same frequency components, and different phases.

3. The method of claim 1, wherein the frequency components of the first RF pulse have substantially the same phase and the frequency components of the second RF pulse have different phases.

4. The method of claim 1, wherein the generating of the image data comprises generating the data using a first sensitivity of a multi-channel coil with respect to the first RF pulse and a second sensitivity of the multi-channel coil with respect to the second RF pulse.

5. The method of claim 1, further comprising:
    generating a total matrix including a first sensitivity of a multi-channel coil with respect to the first RF pulse and a second sensitivity of the multi-channel coil with respect to the second RF pulse,
    wherein the generating of the image data comprises generating the data based on an inverse matrix of the total matrix and the first and second magnetic resonance signals.

6. The method of claim 1, wherein a total volume of the target is grouped such that neighboring sub-volumes belong to at least two mutually exclusive groups respectively, and each of the frequency components of the first and second RF pulses simultaneously excite sub-volumes included in a selected one of the at least two groups.

7. The method of claim 1, wherein the acquiring of the first and second magnetic resonance signals comprises: encoding each of the plurality of excited sub-volumes; and
    acquiring the first and second magnetic resonance signals from the plurality of sub-volumes by using multi-channel coils.

8. A magnetic resonance imaging (MRI) system, the MRI system comprising:
    radio frequency (RF) coils configured to apply, to a target, a first RF pulse comprising different frequency components to simultaneously excite a plurality of non-contiguous sub-volumes constituting a volume of the target, and acquire first magnetic resonance signals from the plurality of sub-volumes, and apply, to the target, a second RF pulse comprising substantially the same frequency components as the first RF pulse and at least one phase different from phases of the first RF pulse, and acquire second magnetic resonance signals from the plurality of sub-volumes; and
    a data processing apparatus that generates image data of the plurality of sub-volumes based on the first and second magnetic resonance signals.

9. The MRI system of claim 8, wherein the first RF pulse and the second RF pulse have the same frequency components, and different phases.

10. The MRI system of claim 8, wherein the frequency components of the first RF pulse have the same phase and the frequency components of the second RF pulse have different phases.

11. The MRI system of claim 8, wherein the data processing apparatus is configured to generate the image data by using a first sensitivity of a multi-channel coil with respect to the first RF pulse and a second sensitivity of the multi-channel coil with respect to the second RF pulse.

12. The MRI system of claim 8, wherein the data processing apparatus is configured to generate a total matrix including a first sensitivity of a multi-channel coil with respect to the first RF pulse and a second sensitivity of the multi-channel coil with respect to the second RF pulse, and generate the data based on an inverse matrix of the total matrix and the first and second magnetic resonance signals.

13. The MRI system of claim 8, wherein a total volume of the target is grouped such that neighboring sub-volumes belong to at least two mutually exclusive groups respectively, and each of the frequency components of the first and second RF pulses simultaneously excite sub-volumes included in a selected one of the at least two groups.

14. The MRI system of claim 8, wherein the RF coils are configured to apply RF pulses to encode each of the plurality of excited sub-volumes, and the RF coils are multi-channel coils that are configured to acquire the first and second magnetic resonance signals from the plurality of sub-volumes.

15. A data processing apparatus, comprising:
    a processor configured to:
    receive first magnetic resonance signals acquired from a plurality of non-contiguous sub-volumes constituting a volume of a target excited by a first radio frequency (RF) pulse comprising different frequency components of different phases to simultaneously excite the plurality of sub-volumes,
    receive second magnetic resonance signals acquired from the plurality of sub-volumes excited by a second RF pulse comprising frequency components having substantially the same frequency components as the frequency components of the first RF pulse and at least one phase different from the phases of the first RF pulse, and generates image data of the plurality of sub-volumes based on the first and second magnetic resonance signals.

\* \* \* \* \*